United States Patent
Abouda et al.

(10) Patent No.: US 9,621,162 B2
(45) Date of Patent: Apr. 11, 2017

(54) HIGH SIDE DRIVER COMPONENT AND METHOD THEREFOR

(71) Applicants: Kamel Abouda, Saint Lys (FR); Estelle Huynh, Toulouse (FR); Thierry Michel Laplagne, Cugnaux (FR)

(72) Inventors: Kamel Abouda, Saint Lys (FR); Estelle Huynh, Toulouse (FR); Thierry Michel Laplagne, Cugnaux (FR)

(73) Assignee: NXP USA, Inc., Austin, TX (US)

(*) Notice: Subject to any disclaimer, the term of this patent is extended or adjusted under 35 U.S.C. 154(b) by 120 days.

(21) Appl. No.: 14/556,403

(22) Filed: Dec. 1, 2014

(65) Prior Publication Data

US 2015/0349776 A1 Dec. 3, 2015

(30) Foreign Application Priority Data

May 27, 2014 (WO) .................. PCT/IB2014/001209

(51) Int. Cl.
*H03K 3/00* (2006.01)
*H03K 19/0175* (2006.01)

(52) U.S. Cl.
CPC .......................... *H03K 19/017509* (2013.01)

(58) Field of Classification Search
USPC ........................................................ 327/109
See application file for complete search history.

(56) References Cited

U.S. PATENT DOCUMENTS

| 7,786,778 B1* | 8/2010 | Mannoorittathu ... H03K 5/1515 326/82 |
| 7,791,406 B1* | 9/2010 | Wang ................. H03K 19/0016 326/34 |
| 7,982,499 B2* | 7/2011 | Ng ....................... G01R 31/002 326/27 |
| 8,120,205 B2 | 2/2012 | Heineman |
| 2009/0009237 A1 | 1/2009 | Ootani |

* cited by examiner

*Primary Examiner* — Lincoln Donovan
*Assistant Examiner* — Patrick Chen
(74) *Attorney, Agent, or Firm* — Charlene R. Jacobsen

(57) ABSTRACT

A high side driver component for generating a drive signal at an output thereof for driving a high side switching device within a high voltage driver circuit. The high side driver component is arranged to operate in at least one reduced slew rate mode in which at least one drive stages is arranged to be in a non-drive state, and the high side driver component further comprises at least one discharge protection component arranged to, when the high side driver component is operating in the at least one reduced slew rate mode, receive an indication of the high voltage driver circuit being in an idle state, and cause the second switching device within the at least one drive stage in a non-drive state to be turned on, in response to the indication of the high voltage driver circuit being in an idle state.

19 Claims, 10 Drawing Sheets

HIGH SIDE DRIVER COMPONENT AND METHOD THEREFOR

CROSS REFERENCE TO RELATED APPLICATION(S)

The present application claims priority to International Patent Application No. PCT/IB2014/001209, entitled "HIGH SIDE DRIVER COMPONENT AND METHOD THEREFOR," filed on May 27, 2014, the entirety of which is herein incorporated by reference.

FIELD OF THE INVENTION

This invention relates to high side driver component, and in particular to a high side driver component for generating a drive signal at an output thereof for driving a high side switching device within a high voltage driver circuit.

BACKGROUND OF THE INVENTION

Integrated high side switches are used in a wide variety of electronic applications. For example, within automotive applications high side switches are used to control airbags, power control units, alternator regulators, window lift applications, injectors control, etc.

Silicon on insulator (SOI) technology refers to the use of a layered silicon-insulator-silicon substrate in place of conventional silicon substrates in semiconductor manufacturing, especially microelectronics, to reduce parasitic device capacitance. However, in non-SOI (bulk) technology integrated circuit (IC) devices, parasitic npn and pnp transistors can unintentionally trigger 'on', degrading IC performances especially when electromagnetic interference (EMI) or electrostatic discharge (ESD) disturbances are applied to the circuit. In particular, such unintentional triggering 'on' of parasitic npn/pnp transistors within integrated high side switches can cause bootstrap capacitors to discharge during an idle mode, resulting in bulk current injection (BCI) failure.

SUMMARY OF THE INVENTION

The present invention provides a high side driver component, a high voltage driver circuit comprising said high side driver component and a method of protecting against bootstrap capacitance discharge within a high side driver component as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
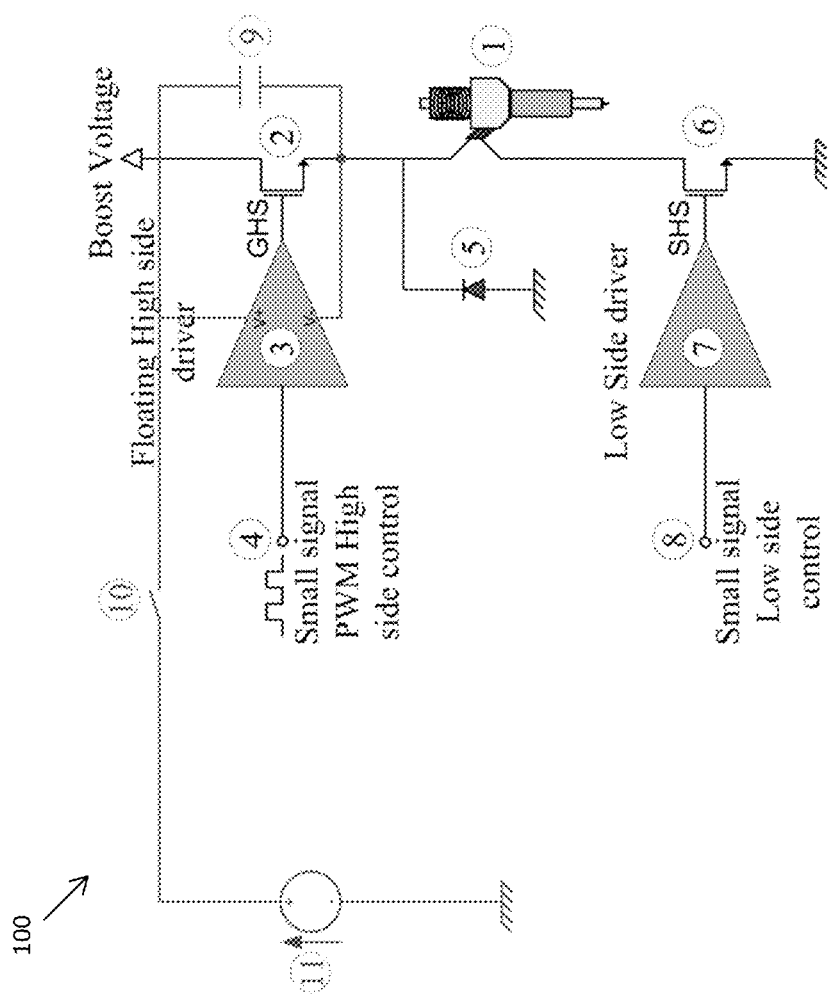
FIG. 1 illustrates a simplified block diagram of a high voltage driver circuit.

The present invention will now be described with reference to the accompanying drawings. However, it will be appreciated that the present invention is not limited to the specific examples herein described and illustrated in the accompanying drawings, and various changes or modifications may be made without departing from the inventive concept.

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

According to examples of a first aspect of the present invention, there is provided a high side driver component for generating a drive signal at an output thereof for driving a high side switching device within a high voltage driver circuit. The high side driver component comprises a plurality of drive stages, each drive stage comprising a first, switching device controllable to operably couple the output of the high side driver component to a high voltage supply node of the high side driver component, and a second switching device controllable to operably couple the output of the high side driver component to a low voltage supply node of the high side driver component when turned on. The high side driver component is arranged to operate in at least one reduced slew rate mode in which at least one of the drive stages is arranged to be in a non-drive state. The high side driver component further comprises at least one discharge protection component arranged to, when the high side driver component is operating in the at least one reduced slew rate mode, receive an indication of the high voltage driver circuit being in an idle state, and cause the second switching device within the at least one drive stage in a non-drive state to be turned on, in response to the indication of the high voltage driver circuit being in an idle state.

In this manner, by switched on the second switching device within the at least one driver stage in a non-drive state during an idle state of the driver circuit, a short circuit between the base and the emitter of a respective parasitic NPN bipolar transistor structures may be created, converting the parasitic NPN bipolar transistor structure into a P-N junction diode structure, and thereby providing protection against discharging of a bootstrap capacitor 9 there through as described in greater detail below.

According to some optional embodiments, the at least one discharge protection component may comprise a comparator component arranged to receive as the indication of the high voltage driver circuit being in an idle state, an indication of an output voltage of the high voltage driver circuit, compare the received indication of the output voltage of the high voltage driver circuit to a reference voltage value, and output an indication of when the output voltage of the high voltage driver circuit is below the reference voltage value. The at least one discharge protection component may also be arranged to cause the second switching device within the at least one drive stage in a non-drive state to be turned on, in response to the comparator component outputting an indication that the output voltage of the high voltage driver circuit is below the reference voltage value.

According to some optional embodiments, the at least one discharge protection component may further comprise a timer circuit. The timer circuit may be arranged to receive the indication of when the output voltage of the high voltage driver circuit is below the reference voltage value, output by the comparator component, and cause the second switching device within the at least one drive stage in a non-drive state to be turned on, after a time delay from the comparator component outputting an indication that the output voltage of the high voltage driver circuit has dropped below the reference voltage value. The timer circuit may comprise a resistance—capacitance, RC, circuit.

According to some optional embodiments, the at least one discharge protection component may comprise a counter component arranged to receive the indication of the high voltage driver circuit being in an idle state, and cause the second switching device within the at least one drive stage in a non-drive state to be turned on after counting a predetermined number of clock cycles from the indication of the high voltage driver circuit being in an idle state.

According to some optional embodiments, the indication of the high voltage driver circuit being in an idle state may comprise an indication of a high side driver control signal, and the counter component may be arranged to cause the second switching device within the at least one drive stage in a non-drive state to be turned on after counting a predetermined number of clock cycles from a transition within the high side driver control signal from a first, drive logical state to a second, idle logical state.

According to some optional embodiments, the predetermined number of clock cycles may be defined within a configurable register.

According to some optional embodiments, the indication of the high voltage driver circuit being in an idle state may comprises at least one of:
an indication of a high side driver control signal;
an indication of an output voltage of the high voltage driver circuit.

According to some optional embodiments, the second switching device within each drive stage may comprise an NMOS device.

According to some optional embodiments, the first switching device within each driver stage may comprise a PMOS device.

According to some optional embodiments, the high side switching device may comprise a MOSFET device.

According to some optional embodiments, the high side driver component may be implemented within an integrated circuit device comprising at least one die within a single integrated circuit package.

According to some examples of a second aspect of the present invention, there is provided a high voltage driver circuit comprising at least one high side driver component according to the first aspect of the invention.

According to some optional embodiments, the at least one high side driver component may comprise a floating voltage supply provided by a bootstrap capacitance.

According to some examples of a third aspect of the present invention, there is provided a method of protecting against bootstrap capacitance discharge within a high side driver component of a high voltage driver circuit during an idle state of the high voltage driver circuit. The method comprises receiving an indication of the high voltage driver circuit being in an idle state, and causing a switching device within the at least one drive stage in a non-drive state to operably couple an output of the high side driver component to a low voltage supply node, in response to the indication of the high voltage driver circuit being in an idle state.

Referring now to FIG. 1, there is illustrated a simplified block diagram of a high voltage driver circuit 100 for driving a high voltage load 1, such as a fuel injector 1. The driver circuit 100 comprises a high side driver component 3 arranged to receive a small signal (low voltage) pulse width modulated (PWM) high side control signal 4, and drive a gate of a high side metal oxide semiconductor field effect transistor (MOSFET) 2 operably coupled to the load 1. The driver circuit 100 of FIG. 1 further comprises a low side driver component 7 arranged to receive a small signal low side control signal 8, and drive a gate of a low side MOSFET 6 operably coupled to the load 1. The high side power switch 2 is typically supplied by a Boost voltage 203. The amount of current provided to the load 1 is then controlled by the on/off periods of the PWM control signal 4. For the driver circuit 100, a freewheeling diode 5 is used to discharge an inductor current inside the load 1.

The gate of the high side MOSFET 2 needs to be at least 7V higher than the boost voltage 203 to guarantee the ON state of the MOSFET 2 in saturation mode (RDSON mode). In many applications, the boost voltage 203 is at the limit of what the particular IC technology can support (e.g. ≥65V). Accordingly, in order to achieve the required 7V increase for the gate of the high side MOSFET 2, it is known to use a bootstrap capacitor 9 to provide a floating voltage supply for the high side driver component 3. A MOSFET is a voltage controlled device which typically will have a gate charge current of only a few nano-Coulombs. This makes it possible to use the charge inside the bootstrap capacitor 9 for control purposes. However, eventually the bootstrap capacitor 9 will lose its charge due to leakage current. As such, it is necessary for the bootstrap capacitor 9 to be periodically recharged in between pulses of the PWM control signal 8. The bootstrap capacitor 9 can be charged through a diode (not shown) placed in series between a DC voltage regulator 11 and the bootstrap capacitor 9 in order to avoid discharging of the bootstrap capacitor during non-charging phases, with a switch 10 used to control the charging of the bootstrap capacitor 9.

Figure 2:
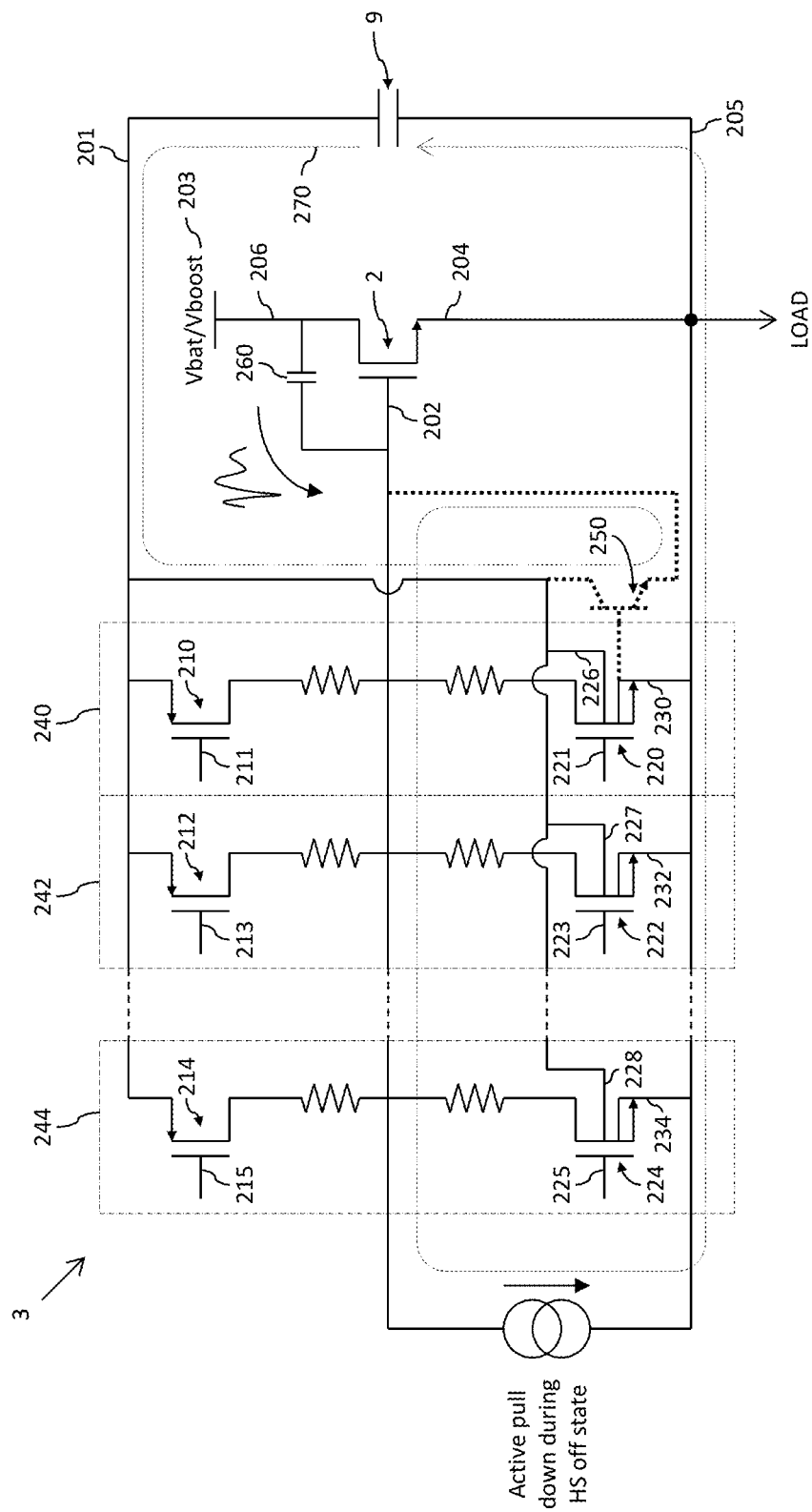
FIG. 2 illustrates a simplified circuit diagram of a high side driver component.

Referring now to FIG. 2 there is illustrated a simplified circuit diagram of a high side driver component 200, such as may be used to implement the high side driver 3 of FIG. 1. The high side driver component 200 has a floating architecture supplied by the bootstrap capacitor 9 to drive the gate 202 of the high side MOSFET 2. The high side driver component 200 comprises multiple stages 240, 242, 244 to enable the high side MOSFET 2 to be driven with different slew rates. Each stage 240, 242, 244 comprises a PMOS switch 210, 212, 214 controllable to operably couple the gate 202 of the high side MOSFET 2 to a high voltage supply node 201, and an NMOS switch 220, 222, 224 controllable to operably couple the gate 202 of the high side MOSFET 2 to a low voltage supply node 205. The PMOS switches 210, 212, 214 are arranged to receive at their gates control signals 211, 213, 215 respectively. The NMOS switches 220, 222, 224 are arranged to receive at their gates control signals 221, 223, 225 respectively.

The low voltage supply node 205 is operably coupled to the source 204 of the high side MOSFET 2, and the bootstrap capacitance 9 is operably coupled between the high voltage supply node 201 and the low voltage supply node 205. In this manner, the charge within the bootstrap capacitor 9 provides a voltage difference between the high voltage supply node 201 and the low voltage supply node 205, and thus provides a floating voltage that may be used to drive the gate 202 of the high side MOSFET 2 high via the PMOS switches 210, 212, 214 to turn the high side MOSFET 2 'on'. Conversely, the gate 202 of the high side MOSFET 2 may be operably coupled to the low voltage supply node 205, and thus to the source 204 of the high side MOSFET 2, via the NMOS switches 220, 222, 224 to turn the high side MOSFET 2 'off'. For simplicity, the charging circuitry for the bootstrap capacitor 9 has not been illustrated in FIG. 2.

In some applications it may be desirable to drive the high side MOSFET 2 with a high slew rate, for example when switching speed of the high side MOSFET 2 is a priority. A higher slew rate may be achieved by driving the gate 202 of the high side MOSFET 2 using more of the stages 240, 242, 244, with the highest slew rate being achieved when all of the stages 240, 242, 244, are used to drive the gate 202 of the high side MOSFET 2. However, in many applications it may be desirable to drive the high side MOSFET 2 with a low slew rate, for example to reduce power spikes, etc. A lower slew rate is achieved by driving the gate 202 of the high side MOSFET 2 using fewer of the stages 240, 242, 244. During such low slew rate operation, not all of the stages 240, 242, 244 are used, with the PMOS switches 210, 212, 214 and the NMOS switches 220, 222, 224 of the inactive stages 240, 242, 244 not being used conventionally held in an off state by their respective control signals 211, 213, 215, 221, 223, 225.

The isolation 226, 227, 228 of each of the NMOS switches 220, 222, 224 between their respective active layer and substrate is connected to the highest voltage present in the circuit, which is the high voltage supply node 201. The bulk of each of the NMOS switches 220, 222, 224 is tied to their respective sources 230, 232, 234, which are coupled to the low voltage supply node 205. The collector of each of the NMOS switches 220, 222, 224 is coupled to the gate 202 of the high side MOSFET 2.

A parasitic NPN bipolar transistor structure is formed within each of the NMOS switches 220, 222, 224, with the body/bulk of the respective NMOS switch 220, 222, 224 comprising a positively doped 'P' layer between two negatively doped 'N' layers of the isolation 226, 227, 228 (forming the 'collector') and the drain 231, 233, 235 (forming the 'emitter') of the NMOS switch 220, 222, 224. The parasitic NPN bipolar transistor structure for the NMOS switch 220 is illustrated in dotted lines at 250.

To reduce noise generated by high current flow during switching phases, it is known to introduce a miller capacitance 260 between the drain 206 and the gate 202 of the high side MOSFET 2. When the high side MOSFET 2 is in an OFF state, the miller capacitance 260 couples noise 265 at the drain 206 of the high side MOSFET 2 to the gate 202, which during an OFF state is being driven low, allowing the noise to be coupled to the low voltage supply node 205 and the source 204 of the high side MOSFET 2.

However, when the high side driver component 200 is operating in a low slew rate mode, the path between the gate 202 of the high side MOSFET 2 and the low voltage supply node 205 may not be a particularly low impedance path due to only a small number, for example one, of the NMOS switches being used to couple the gate 202 of the high side MOSFET 2 to the low voltage supply node 205 (lowest slew rate results in highest Ron+serial drain resistance between the gate 202 of the high side MOSFET 2 and the low voltage supply node 205). The relatively high impedance that can exist between the gate 202 of the high side MOSFET 2 and the low voltage supply node 205 during a low slew rate operating mode of the high side driver component 200 can result in a high peak to peak voltage at the gate 202 of the high side MOSFET 2 caused by noise 265 passing through the miller capacitance 260.

Significantly, during an idle state of the driver circuit 100 (i.e. when both the high side MOSFET 2 and the low side MOSFET 6 are being driven in an 'off' state, noise 265 at the drain 206 of the high side MOSFET 2 can cause the voltage at the gate 202 of the high side MOSFET 2 to fall below the source voltage, for example when electromagnetic interference (EMI) or electrostatic discharge (ESD) disturbances are applied to the circuit. Under such circumstances, the parasitic NPN bipolar transistor structures of the NMOS switches 220, 222, 224 not in use during a low slew rate operating mode of the high side driver component 200 can be caused to trigger 'on', resulting in the bootstrap capacitor 9 discharging there through, as indicated by the dashed arrow 270 in FIG. 2, with the NMOS switches 220, 222, 224 in providing the active pull down during the high side off state.

Figure 3:
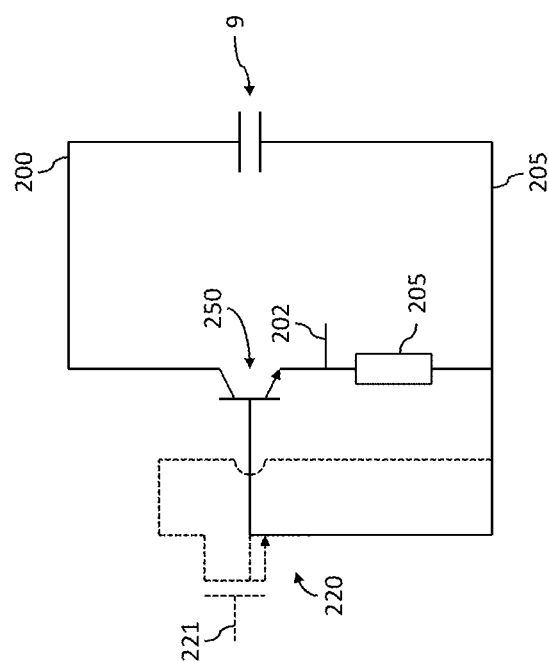
FIG. 3 illustrates a simplified circuit diagram of a parasitic NPN bipolar transistor structure.

FIG. 3 illustrates a simplified circuit diagram of the parasitic NPN bipolar transistor structure 250 of the NMOS switch 220 of FIG. 2. As can more clearly be seen in FIG. 3, the base-emitter voltage for the parasitic NPN bipolar transistor structure 250 is provided by the voltage drop across the Ron+serial drain resistance of the NMOS switches 220, 222, 224 between the gate 202 of the high side MOSFET 2 and the low voltage supply node 205, illustrated in FIG. 3 by resistance 20010. When the voltage at the gate 202 of the high side MOSFET 2 falls below the source voltage, for example when electromagnetic interference (EMI) or electrostatic discharge (ESD) disturbances are applied to the circuit, the base-emitter voltage for the parasitic NPN bipolar transistor structure 250 becomes positive, and if sufficiently large can trigger the parasitic NPN bipolar transistor structure 250 'on', allowing charge stored within the bootstrap capacitor 9 to discharge through the parasitic NPN bipolar transistor structure 250.

Figure 4:
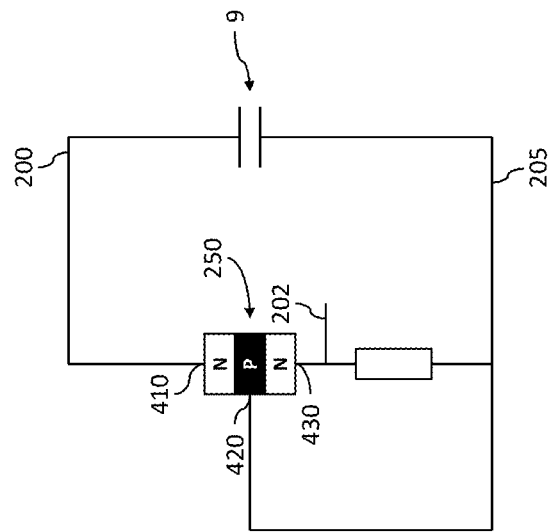
FIGS. 4 and 5 illustrates a simplified structural diagram of a parasitic NPN bipolar transistor structure.
Figure 7:
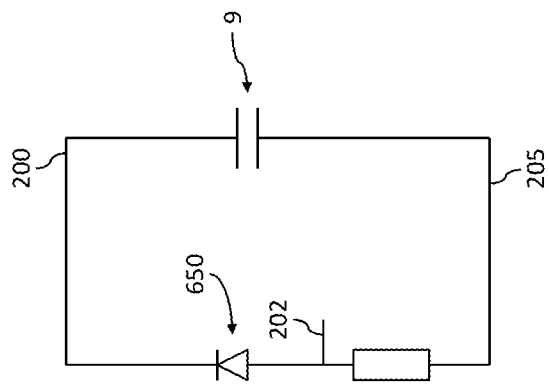
FIG. 7 illustrates a simplified circuit diagram of the P-N junction diode structure.
Figure 6:
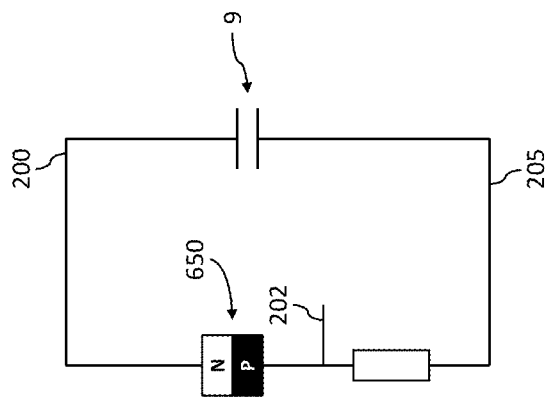
FIG. 6 illustrates a simplified structural diagram of a P-N junction diode structure created by shorting out the base and the emitter of the parasitic NPN bipolar transistor structure.
Figure 5:
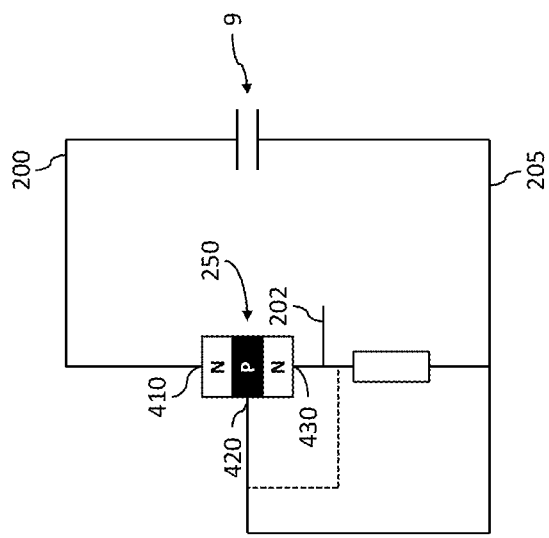

FIG. 4 illustrates a simplified structural diagram of the parasitic NPN bipolar transistor structure 250 of the NMOS switch 220 of FIG. 2. As illustrated in FIG. 4, the parasitic NPN bipolar transistor structure 250 comprises a first, N-P junction between the collector 410 and the base 420 of the parasitic NPN bipolar transistor structure 250, and a second, P-N junction between the base 420 and the emitter 430 of the parasitic NPN bipolar transistor structure 250. The inventors have recognised that, by shorting out the base 420 and the emitter 430 of the parasitic NPN bipolar transistor structure 250, as illustrated in FIG. 5, the parasitic NPN bipolar transistor structure 250 may be converted to a simple P-N junction diode structure 650, as illustrated in FIG. 6. FIG. 7 illustrates a simplified circuit diagram of such a P-N junction diode structure 650 formed when the base 420 and the emitter 430 of the parasitic NPN bipolar transistor structure 250 have been shorted. As illustrated in FIG. 7, the orientation of the P-N junction diode structure 650 is such that current flow there through from the high voltage supply node 201 to the low voltage supply node 205 is prevented, thereby preventing discharge of the bootstrap capacitor 9 there through.

Referring back to FIG. 2, as previously mentioned the NMOS switches 220, 222, 224 of the inactive stages 240, 242, 244 not used during a low slew rate mode of operation are conventionally held in an off state by their respective control signals 211, 213, 215, 221, 223, 225. However, it is proposed that the NMOS switches 220, 222, 224 of the inactive stages 240, 242, 244 may be switched on during an idle state of the driver circuit 100 to create the short circuit between the base 420 and the emitter 430 of their respective parasitic NPN bipolar transistor structures 250, and thereby to protect against discharging of the bootstrap capacitor 9 there through.

Figure 8:
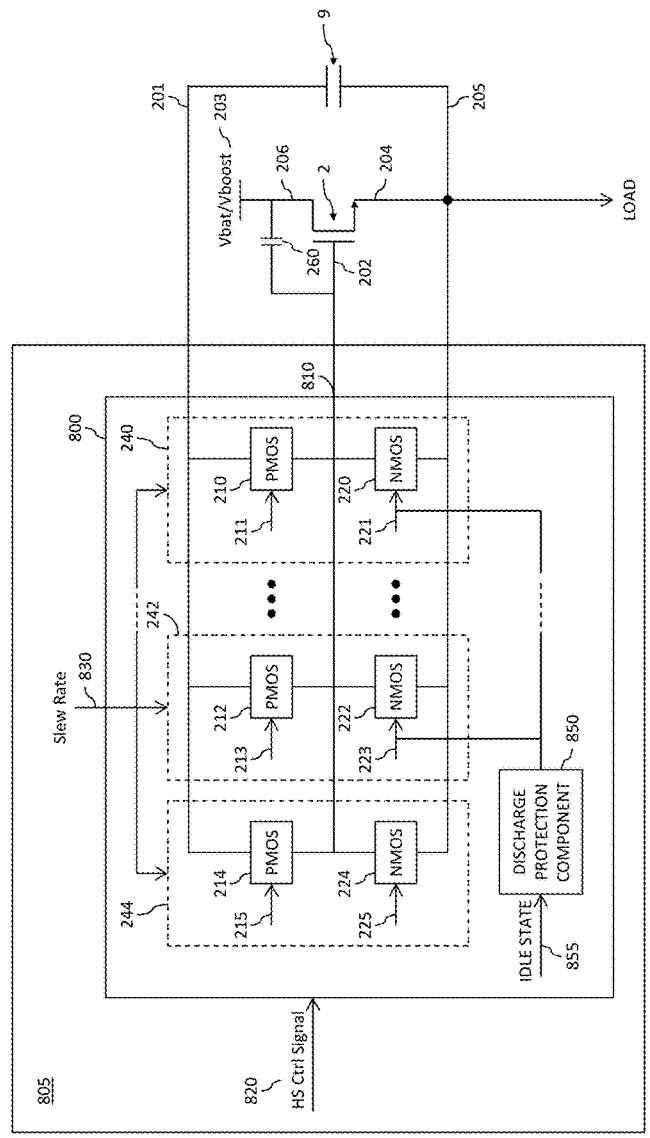
FIG. 8 illustrates a simplified block diagram of an example of an alternative high side driver component.

Referring now to FIG. 8, there is illustrated a simplified block diagram of an example of an alternative high side driver component 800. In some examples, the high side driver component 800 may be implemented within an integrated circuit device 805 comprising at least one die within a single integrated circuit package. The high side driver component 800 may form a part of a high voltage driver circuit, such as the high side driver component 3 within high voltage driver circuit 100 of FIG. 1. The high side driver component 800 has a floating architecture supplied by the bootstrap capacitor 9 to drive an output 810 thereof. For simplicity, the charging circuitry for the bootstrap capacitor 9 has not been illustrated in FIG. 8. The high side driver component 800 is arranged to generate a drive signal at the output 810 thereof for driving a high side switching device within the high voltage driver circuit. In the illustrated example, the output 810 of the high side driver component 800 is operably coupled to the gate 202 of the high side MOSFET 2.

The high side driver component 800 comprises a plurality of drive stages 240, 242, 244 to enable the high side MOSFET 2 to be driven with different slew rates. Each drive stage 240, 242, 244 comprises a first switching device, which in the illustrated example comprises a PMOS switch 210, 212, 214, controllable to operably couple the output 810 of the high side driver component 800 to a high voltage supply node 201 when turned on. Each stage drive 240, 242, 244 further comprises a second switching device, which in the illustrated example comprises an NMOS switch 220, 222, 224, controllable to operably couple the output 810 of the high side driver component 800 to a low voltage supply node 205 when turned on. The PMOS switches 210, 212, 214 are arranged to receive at their gates control signals 211, 213, 215 respectively. The NMOS switches 220, 222, 224 are arranged to receive at their gates control signals 221, 223, 225 respectively.

In the illustrated example, the low voltage supply node 205 is operably coupled to the source 204 of the high side MOSFET 2, and the bootstrap capacitance 9 is operably coupled between the high voltage supply node 201 and the low voltage supply node 205. In this manner, the charge within the bootstrap capacitor 9 provides a voltage difference between the high voltage supply node 201 and the low voltage supply node 205, and thus provides a floating voltage that may be used to drive the gate 202 of the high side MOSFET 2 high via the PMOS switches 210, 212, 214 to turn the high side MOSFET 2 'on'. Conversely, the gate 202 of the high side MOSFET 2 may be operably coupled to the low voltage supply node 205, and thus to the source 204 of the high side MOSFET 2, via the NMOS switches 220, 222, 224 to turn the high side MOSFET 2 'off'.

The high side driver component 800 is arranged to operate in at least one reduced slew rate mode in which at least one of the drive stages 240, 242, 244 is arranged to be in a non-drive state. Conventionally, during such a reduced slew rate mode the control signals 211, 213, 215, 221, 223, 225 of the switching devices 210, 212, 214, 220, 222, 224 of the drive stages in such a non-drive state are configured to hold their respective switching devices 210, 212, 214, 220, 222, 224 in an off state (i.e. a non-conductive state).

In the illustrated example, the high side driver component 800 is arranged to receive a high side control signal 820, which may comprise a small signal (low voltage) pulse width modulated (PWM) control signal such as the high side control signal 4 of FIG. 1. The control signals 211, 213, 215, 221, 223, 225 provided to the switching devices 210, 212, 214, 220, 222, 224 (unless in a non-drive state stage 240, 242, 244) are derived from the high side control signal 820. For example, the control signals 211, 213, 215 provided to those PMOS switches 210, 212, 214 not in a non-drive state stage may comprise a signal representative of the high side control signal 820, but with slightly delayed rising edges to slightly delay the switching on of the PMOS switches 210, 212, 214 relative to the rising edges of the high side control signal 820. Similarly, the control signals 221, 223, 225 provided to those NMOS switches 220, 222, 224 not in a non-drive state stage may comprise a signal representative of the high side control signal 820, but with slightly delayed falling edges to slightly delay the switching on of the NMOS switches 220, 222, 224 relative to the falling edges of the high side control signal 820. In this manner, the switching on/off of the switching devices 210, 212, 214, 220, 222, 224 follows substantially directly the transitions within the high side control signal 820, albeit with slight delays in the turning on of the switching devices 210, 212, 214, 220, 222, 224 to prevent low resistance current paths being created between the high and low voltage nodes 201, 205 during the transition phases.

In the illustrated example, the high side driver component 800 is further arranged to receive a slew rate control signal 830, and to configure the drive stages 240, 242, 244 into drive and non-drive states in accordance with the slew rate control signal 830. For example, the slew rate control signal 830 may comprise a single electrical signal arranged to indicate whether the high side driver component 800 is to be operating in a high slew rate or low slew rate mode. In such an example, the high side driver component 800 may be arranged to configure a subset of the drive stages 240, 242, 244 into a drive or non-drive state depending on the slew rate control signal 830. For example, when a drive stage 240, 242, 244 is required to be in a non-drive state, the high side driver component 800 may gate, or otherwise override, the control signals 211, 213, 215, 221, 223, 225 provided to the respective switching devices 210, 212, 214, 220, 222, 224 of said drive stage 240, 242, 244, and cause the respective control signals 211, 213, 215, 221, 223, 225 to be held in an 'off' state such that they are arranged to hold their respective switching devices 210, 212, 214, 220, 222, 224 in an off (non-conductive) state. In some alternative examples, the slew rate control signal 830 may comprise multiple electrical signals with which the high side driver component 800 may be configured to implement numerous different slew rate configurations for the drive stages 240, 242, 244.

In the example illustrated in FIG. 8, the high side driver component 800 further comprises at least one discharge protection component 850. The discharge protection component 850 is arranged, at least when the high side driver component 800 is operating in a reduced slew rate mode, to receive an indication 855 of the high side driver circuit 100 being in an idle state, and to cause the NMOS switching device(s) 220, 222, 224 within the drive stage(s) 240, 242, 244 that are in a non-drive state to be turned on in response to the indication 855 of the high voltage driver circuit 100 being in an idle state.

In this manner, by causing the NMOS switch 220, 222, 224 within the non-drive state stage 240, 242, 244 to be turned on when the high voltage driver circuit 100 is in an idle state, the NMOS switch is caused to operably couple the output 810 of the high side driver component 800 (and thus the emitter of the parasitic NPN bipolar transistor structure of the NMOS switch 220, 222, 224) to the low voltage supply node 205 (and thus the base of the parasitic NPN bipolar transistor structure of the NMOS switch 220, 222, 224). As such, the base 420 and the emitter 430 of the parasitic NPN bipolar transistor structure 250 of the NMOS switch 220, 222, 224 within the non-drive state stage 240, 242, 244 is shorted out, as illustrated in FIG. 5, thereby converting the parasitic NPN bipolar transistor structure 250 a simple P-N junction diode structure 650, as illustrated in FIG. 6. In this manner, current flow there through from the high voltage supply node 201 to the low voltage supply node 205 is prevented, thereby preventing discharge of the bootstrap capacitor 9 there through, even when the voltage at the gate 202 of the high side MOSFET 2 falls below the source voltage, such as when electromagnetic interference (EMI) or electrostatic discharge (ESD) disturbances are applied to the circuit.

Figure 9:
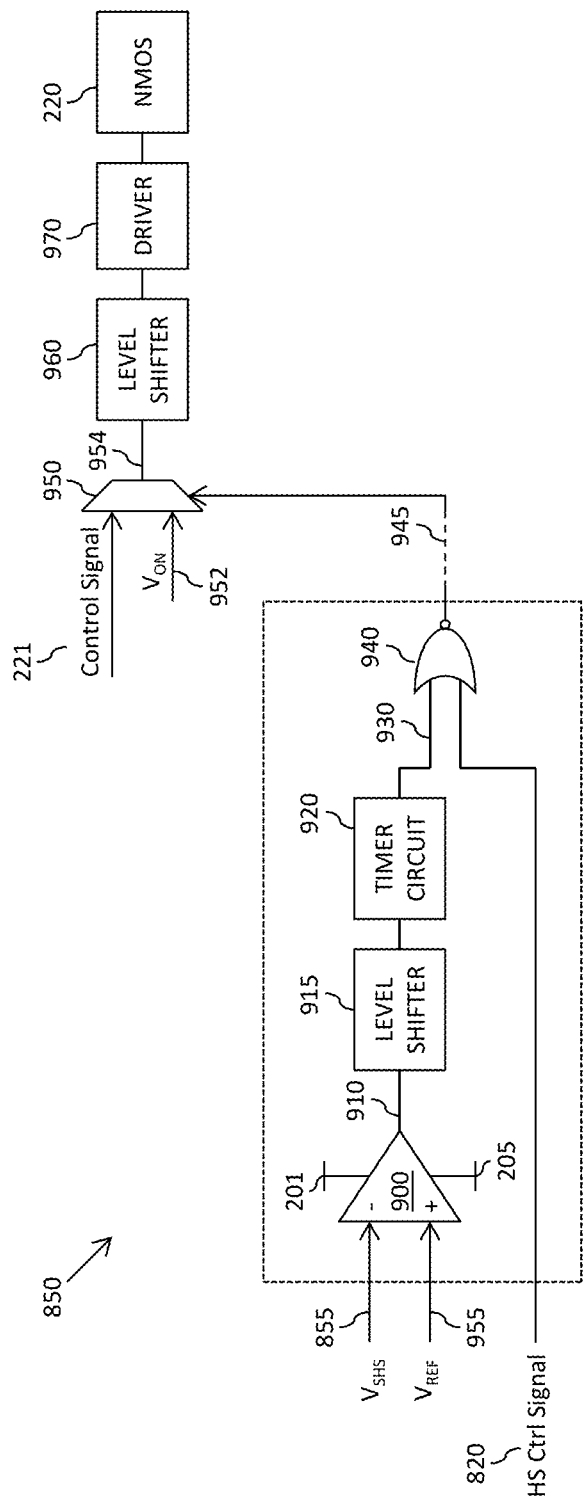
FIG. 9 illustrates a simplified block diagram of an example of a discharge protection component.

FIG. 9 illustrates a simplified block diagram of an example of the discharge protection component 850. In the example illustrated in FIG. 9, the discharge protection component 850 comprises a comparator component 900 arranged to receive as the indication 855 of the high voltage driver circuit 100 being in an idle state, an indication of an output voltage of the high voltage driver circuit 100. For Example, such an indication 855 may comprise the voltage ($V_{SHS}$) at the source 204 of the high side MOSFET 2. The comparator component 900 is further arranged to receive a reference voltage value ($V_{REF}$) 955, and to compare the received indication 855 of the output voltage of the high voltage driver circuit 100 to the reference voltage value 955, and output an indication 910 of when the output voltage of the high voltage driver circuit 100 is below the reference voltage value 955. In particular in the illustrated example, the comparator component 900 is arranged to output an indication 910 comprising logical low value when the output voltage of the high voltage driver circuit 100 is above the reference voltage value 955, and an indication 910 comprising a logical high value when the output voltage of the high voltage driver circuit 100 is below the reference voltage value 955.

The discharge protection component in the example illustrated in FIG. 9 further comprises a timer circuit 920. The timer circuit 920 is arranged to receive the indication 910 of when the output voltage of the high voltage driver circuit 100 is below the reference voltage value 955 output by the comparator component 900. In the illustrated example, a level shifter 915 is provided between output of the comparator component 900 and the input of the timer circuit 920 to compensate for the differing voltage levels between control signals, floating voltage supplies, etc. The timer circuit 920 is arranged to cause the NMOS switches 220, 222, 224 within non-drive state stages 240, 242, 244 to be turned on after a time delay from the comparator component 900 outputting an indication 910 that the output voltage of the high voltage driver circuit 100 has dropped below the reference voltage value 955. For example, the timer circuit 920 may be arranged to output a time delayed signal 930 to be provided to (at least) the NMOS switches 220, 222, 224 within non-drive state stages 240, 242, 244. In the example illustrated in FIG. 9, the delayed signal 930 output by the timer circuit 920 is provided to the NMOS switches 220, 222, 224 via a NOR gate 940. The NOR gate 940 is further arranged to receive the high side control signal 820. In this manner, the NOR gate 940 is arranged to output a signal 945 inversely representative of the delayed signal 930 output by the timer circuit 920 whilst the high side control signal 820 comprises a logical low value. This signal 945 inversely representative of the delayed signal 930 output by the timer circuit 920 may then be used to cause the NMOS switches 220, 222, 224 within non-drive state stages 240, 242, 244 to be turned on in response to the comparator component 900 outputting an indication 910 that the output voltage of the high voltage driver circuit 100 is below the reference voltage value 955.

The signal 945 may cause the NMOS switches 220, 222, 224 within non-drive state stages 240, 242, 244 to be turned on in any suitable manner. For example, the control signals 221, 223, 225 of the NMOS switches 220, 222, 224 within stages 240, 242, 244 that may be configured into a non-drive state during reduced slew operating modes may be provided to the gates of their respective NMOS switches 220, 222, 224 via multiplexer components. FIG. 9 illustrates such a multiplexer component 950 for the NMOS switch 220, which receives at a first input thereof the control signal 221 for the NMOS switch 220, and a voltage signal ($V_{ON}$) 952 at a second input thereof suitable for switching on the NMOS switch 220 when applied to the gate thereof. The signal output by the NOR gate 940 is provided to a control input of a multiplexer 950. An output 954 of the multiplexer 950 is operably coupled to the gate of the NMOS switch 220 (via a further level shifter 960 and a driver circuit 970 in the illustrated example). In this manner, the multiplexer 950 is controllable to output to the gate of the NMOS switch 220 either the control signal 221 or the voltage signal ($V_{ON}$) 952 depending on the signal 945 output by the NOR gate 940. Specifically, the multiplexer 950 in the illustrated example may be arranged to output the voltage signal ($V_{ON}$) 952 when the NOR gate 940 outputs a logical high signal 945, and to output the control signal 221 when the NOR gate 940 outputs a logical low signal 945.

Figure 10:
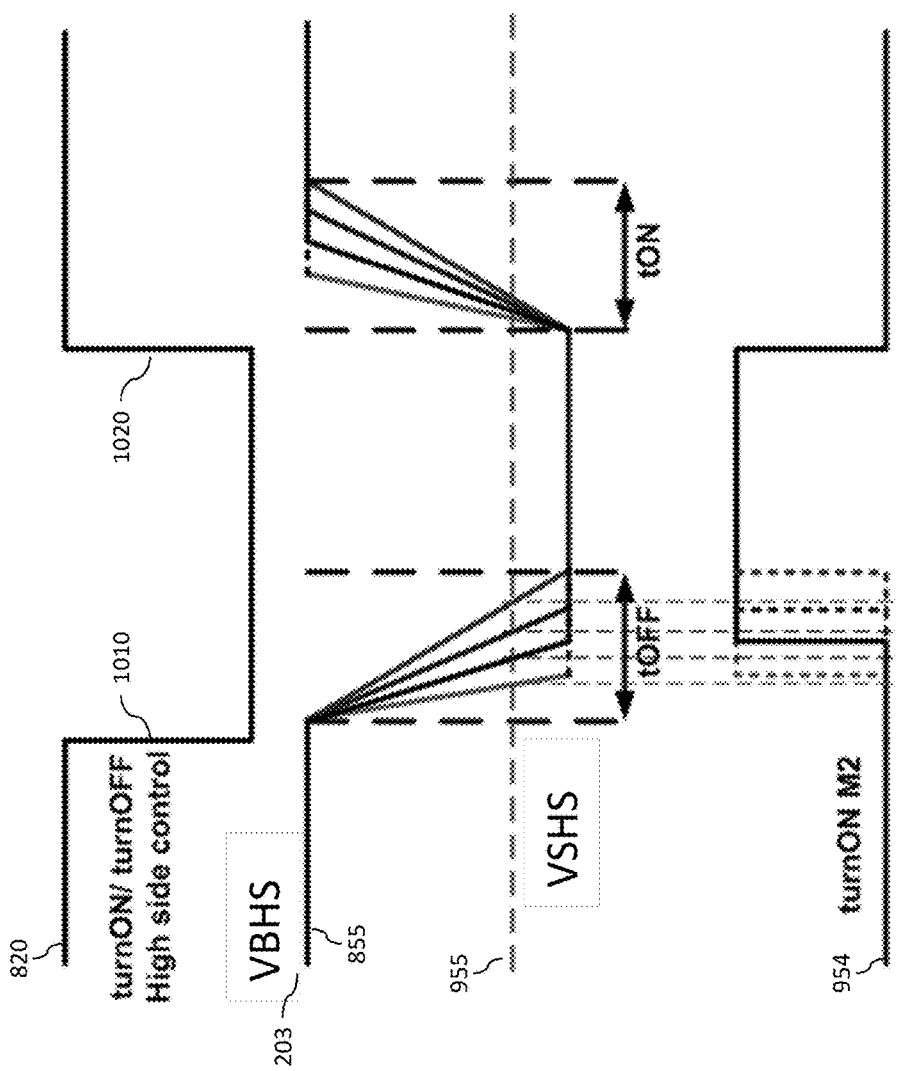
FIG. 10 illustrates a simplified timing diagram for the example discharge protection component illustrated in FIG. 9.

FIG. 10 illustrates a simplified timing diagram for the example discharge protection component 850 illustrated in FIG. 9. The timing diagram starts during a pulse phase of the pulse width modulated high side control signal 820. During such a pulse phase of the high side control signal 820, the PMOS switches 210, 212, 214 within stages 240, 242, 244 of the high side driver component 800 that are in a drive state are switched on, thereby operably coupling the gate 202 of the high side MOSFET 2 to the high voltage supply node 201, switching the MOSFET 2 on and causing the output voltage of the high voltage driver circuit 100 to be driven up to the Boost voltage 203. Furthermore, during such a pulse phase of the high side control signal 820, the output 945 of the NOR gate 940 is held low, thereby controlling the multiplexer component 950 in FIG. 9 to output to the gate of the NMOS switch 220 the control signal 221, which in the illustrated example comprises a logical low level intended to hold the NMOS switch 220 in an off state due to the NMOS switch 220 being within a non-drive state stage 240.

At 1010, the high side control signal 820 transitions to a non-pulse phase, during which the PMOS switches 210, 212, 214 within stages 240, 242, 244 of the high side driver component 800 that are in a drive state are switched off, thereby isolating the gate 202 of the high side MOSFET 2 from the high voltage supply node 201, switching the MOSFET 2 off. As a result, the high voltage drive circuit 100 enters an idle state, with the output voltage of the high voltage driver circuit 100 no longer being driven up to the Boost voltage 203. As a result, the output voltage of the high voltage driver circuit 100 begins to fall. When the indication 855 of the output voltage of the high voltage driver circuit 100 falls below the reference voltage value ($V_{REF}$) 955, the output of the comparator component 900 changes from a high logical level to a low logical level. After a delay period, the delayed signal 930 output by the timer circuit 920 also transitions from a high logical level to a low logical. Because the high side control signal 820 no longer comprises a high logical level, the output 945 of the NOR gate 940 is no longer held low. Accordingly, when the delayed signal 930 output by the timer circuit 920 transitions from high to low, the output 945 of the NOR gate transitions from low to high, causing the multiplexer component 950 to switch to outputting the voltage signal ($V_{ON}$) 952, thereby causing the NMOS switch 220 to be turned on, thereby preventing discharge of the bootstrap capacitor 9 there through.

A illustrated in FIG. 10, the switching on of the NMOS switch 220 is delayed relative to the transition 1010 of the high side control signal 820 to the non-pulse phase in order to avoid a low resistance current path being created between the high and low voltage nodes 201, 205 during the transition. In the example illustrated in FIGS. 9 and 10, such a delay is provided firstly by the time taken for the output voltage of the high voltage driver circuit 100 to fall below the reference voltage value ($V_{REF}$) 955, and secondly by the time delay provided by the timer circuit 920. When the high side control signal 820 subsequently transitions back to a pulse phase, at 1020, the NMOS switch 220 is required to be turned off straight away in order to avoid a low resistance current path being created between the high and low voltage nodes 201, 205 during the transition; i.e. before the PMOS switches 210, 212, 214 within stages 240, 242, 244 of the high side driver component 800 that are in a drive state are switched on again. This is achieved in the illustrated example of FIG. 9 by virtue of the high logical state of the high side control signal 820 following such a transition forcing the output 945 of the NOR gate 940 low, which in turn causes the multiplexer component 950 to switch back to outputting the control signal 211, thereby causing the NMOS switch 220 to be turned off substantially without any significant delay.

Referring back to FIG. 9, in some examples the comparator component 900 may comprise a floating comparator. For example, the comparator component 900 may comprise supply voltages provided by the high and low voltage supply nodes 201, 205. The timer circuit 920 may be implemented in any suitable manner. For example, the timer circuit 920 may comprise a simple resistance-capacitance (RC) circuit.

Figure 11:
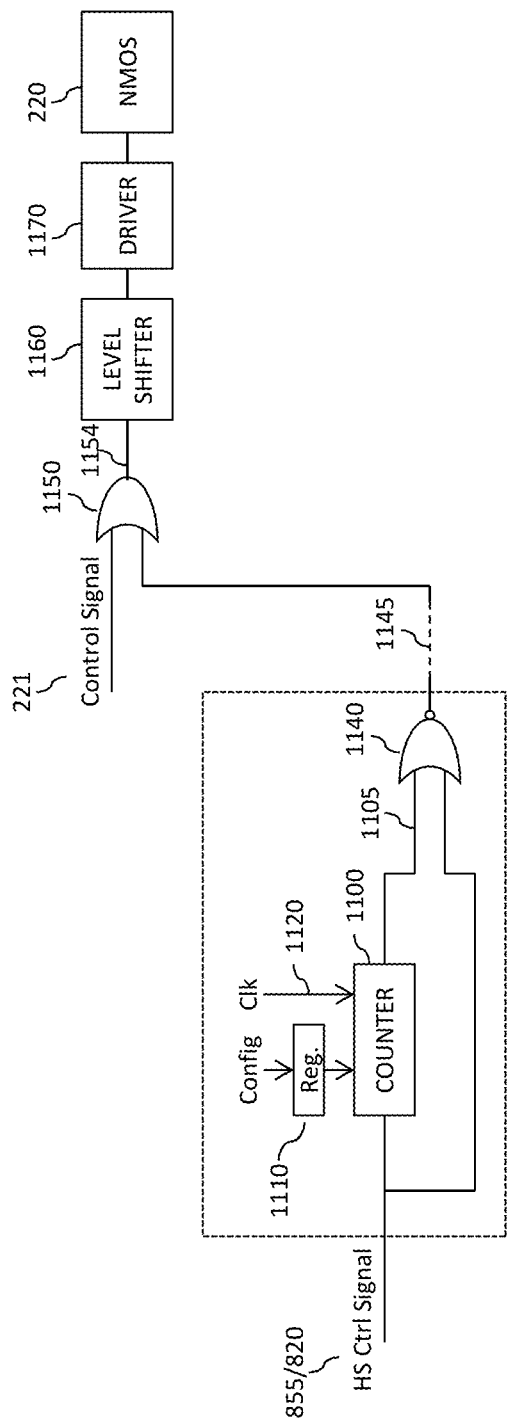
FIG. 11 illustrates a simplified block diagram of an alternative example of a discharge protection component.

FIG. 11 illustrates a simplified block diagram of an alternative example of the discharge protection component 850 of FIG. 8. In the example illustrated in FIG. 11, the discharge protection component 850 comprises a digital counter component 1100 arranged to receive as the indication 855 of the high voltage driver circuit 100 being in an idle state the high side control signal 820. For example, the transition of the high side control signal 820 from a pulse phase comprising a first, drive logical state to a non-pulse phase comprising a second, idle logical state within the pulse width modulated signal may be considered to comprise an indication that the high voltage driver circuit 100 has entered an idle state. The discharge protection component 850 in FIG. 11 is arranged to cause the NMOS switches 220, 222, 224 within non-drive state stages 240, 242, 244 to be turned on after counting a predetermined number of clock cycles from the indication of the high voltage driver circuit 100 entering an idle state.

For example, and as illustrated in FIG. 11, the digital counter component 1100 may be further operably coupled to a register 1110 within which a count value is stored, and to a clock signal 1120. Upon the high side control signal 820 transitioning from a pulse phase comprising a first, drive logical state to a non-pulse phase comprising a second, idle logical state, the digital counter component 1100 may be arranged to be initialised to comprise the count value stored within the register 1110, and to reset an output signal 1105 therefrom to comprise, say, a logical high signal. The digital counter component 1100 may then count down the clock cycles of the clock signal 1120 until the digital counter component 1100 reaches, say, a zero value, at which point the digital counter component 1100 may cause its output 1105 to transition from a logical high signal to logical low signal. In the illustrated example, the output signal 1105 from the digital counter component 1100 is provided to the NMOS switches 220, 222, 224 via a NOR gate 1140. The NOR gate 1140 is further arranged to receive the high side control signal 820. In this manner, the NOR gate 1140 is arranged to output a signal 1145 inversely representative of the output signal 1105 from the digital counter component 1100 whilst the high side control signal 820 comprises a logical low value. The output signal 1105 from the digital counter component 1100 may then be used to cause the NMOS switches 220, 222, 224 within non-drive state stages 240, 242, 244 to be turned on in response to the expiration of the digital counter component 1100 counting down from the count value stored within the register 1110.

The signal 1145 may cause the NMOS switches 220, 222, 224 within non-drive state stages 240, 242, 244 in any suitable manner. For example, the control signals 221, 223, 225 of the NMOS switches 220, 222, 224 within stages 240, 242, 244 that may be configured into a non-drive state during reduced slew operating modes may be provided to the gates of their respective NMOS switches 220, 222, 224 via multiplexer components, such as illustrated in FIG. 9. In some alternative examples, the control signals 221, 223, 225 of the NMOS switches 220, 222, 224 within stages 240, 242, 244 that may be configured into a non-drive state during reduced slew operating modes may be provided to the gates of their respective NMOS switches 220, 222, 224 via OR gates. FIG. 11 illustrates such an OR gate 1150 for the NMOS switch 220, which receives at a first input thereof the control signal 221 for the NMOS switch 220, and the signal 1145 output by the NOR gate 1140 at a second input thereof. An output 1154 of the OR gate 1150 is operably coupled to the gate of the NMOS switch 220 (again via a level shifter 1160 and a driver circuit 1170 in the illustrated example). In this manner, the OR gate 1150 is forced to output a logical high signal when the NOR gate 1140 outputs a logical high signal 1145, and to output the control signal 221 when the NOR gate 1140 outputs a logical low signal 1145.

Figure 12:
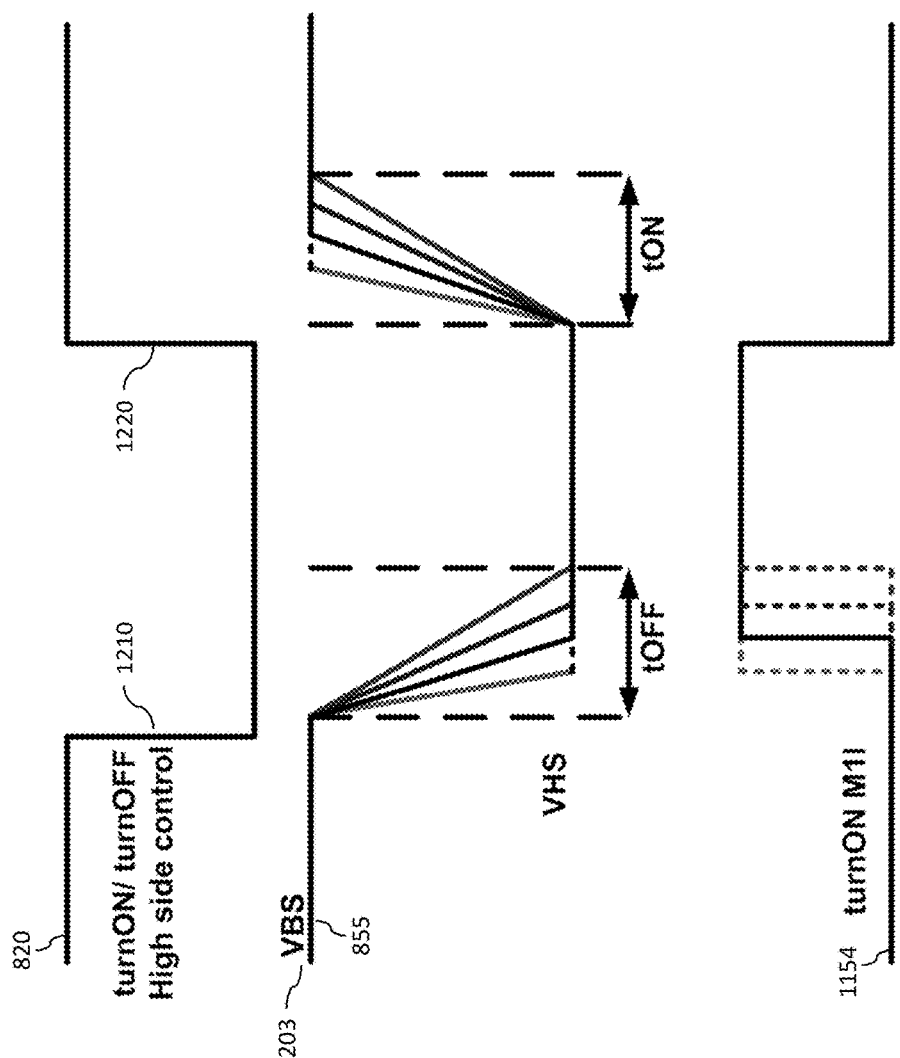
FIG. 12 illustrates a simplified timing diagram for the example discharge protection component illustrated in FIG. 11.

FIG. 12 illustrates a simplified timing diagram for the example discharge protection component 850 illustrated in FIG. 12. The timing diagram starts during a pulse phase of the pulse width modulated high side control signal 820. During such a pulse phase of the high side control signal 820, the PMOS switches 210, 212, 214 within stages 240, 242, 244 of the high side driver component 800 that are in a drive state are switched on, thereby operably coupling the gate 202 of the high side MOSFET 2 to the high voltage supply node 201, switching the MOSFET 2 on and causing the output voltage of the high voltage driver circuit 100 to be driven up to the Boost voltage 203. Furthermore, during such a pulse phase of the high side control signal 820, the output 1145 of the NOR gate 1140 is held low, thereby causing the OR gate 1150 in FIG. 11 to output to the gate of the NMOS switch 220 the control signal 221, which in the illustrated example comprises a logical low level intended to hold the NMOS switch 220 in an off state due to the NMOS switch 220 being within a non-drive state stage 240.

At 1210, the high side control signal 820 transitions to a non-pulse phase, during which the PMOS switches 210, 212, 214 within stages 240, 242, 244 of the high side driver component 800 that are in a drive state are switched off, thereby isolating the gate 202 of the high side MOSFET 2 from the high voltage supply node 201, switching the MOSFET 2 off. As a result, the high voltage driver circuit 100 enters an idle state, with the output voltage of the high voltage driver circuit 100 no longer being driven up to the Boost voltage 203. As a result, the output voltage of the high voltage driver circuit 100 begins to fall.

Upon the high side control signal 820 transitioning from a pulse phase comprising a first, drive logical state to a non-pulse phase comprising a second, idle logical state, the digital counter component 1100 is initialised to comprise the count value stored within the register 1110, and to reset the output signal 1105 therefrom to comprise a logical high signal. This logical high output signal 1105 from the digital counter component 1100 causes the output 1145 of the NOR gate 1140 to initially be maintained low. The digital counter component 1100 then counts down the clock cycles of the clock signal 1120 until the digital counter component 1100 reaches a zero value, at which point the digital counter component 1100 causes its output 1105 to transition from a logical high signal to logical low signal. Because the high side control signal 820 no longer comprises a high logical level, the output 1145 of the NOR gate 1140 is no longer held low. Accordingly, when point the digital counter component 1100 causes its output 1105 to transition from a logical high signal to logical low signal, the output 1145 of the NOR gate transitions from low to high, forcing the OR gate 1150 in FIG. 11 to output a logical high signal, causing the NMOS switch 220 to be turned on, thereby preventing discharge of the bootstrap capacitor 11 there through.

A illustrated in FIG. 12, the switching on of the NMOS switch 220 is delayed relative to the transition 1210 of the high side control signal 820 to the non-pulse phase in order to avoid a low resistance current path being created between the high and low voltage nodes 201, 205 during the transition. In the example illustrated in FIGS. 11 and 12, such a delay is provided by the digital counter component 1100 counting down the number of clock cycles from the count value stored within the register 1110. When the high side control signal 820 subsequently transitions back to a pulse phase, at 1220, the NMOS switch 220 is required to be turned off straight away in order to avoid a low resistance current path being created between the high and low voltage nodes 201, 205 during the transition; i.e. before the PMOS switches 210, 212, 214 within stages 240, 242, 244 of the high side driver component 800 that are in a drive state are switched on again. This is achieved in the illustrated example of FIG. 11 by virtue of the high logical state of the high side control signal 820 following such a transition forcing the output 1145 of the NOR gate 1140 low, which in turn causes the OR gate 1150 to switch back to outputting the control signal 211, thereby causing the NMOS switch 220 to be turned off substantially without any significant delay.

Referring back to FIG. 11, in some examples the register 1110 may comprise a configurable register. In this manner, the predetermined number of clock cycles counted down by the digital counter component may be configured by, for example, software based on any suitable parameters. For example, the count value may be configured based on a configured slew rate of the high side driver component 800 and/or clock speed.

The provision of a discharge protection component 850 arranged to cause the NMOS switches 220, 222, 224 within non-drive state stages 240, 242, 244 to be turned on when the high voltage driver circuit 100 is in an idle state as herein described with reference to the accompanying drawings provides protection against discharging of the bootstrap capacitance 9 by shorting out the base and the emitter of the parasitic NPN bipolar transistor structures, converting the parasitic NPN bipolar transistor structures into P-N junction diode structures.

Advantageously, examples herein described make the high side driver component 800 robust versus EMC and ESD independently of application case and external components used. Furthermore, the examples herein described provide such protection without the need to change any parameter (slew rate, iso connections, etc.), thereby avoiding the potential introduction of unwanted behaviour.

Figure 13:
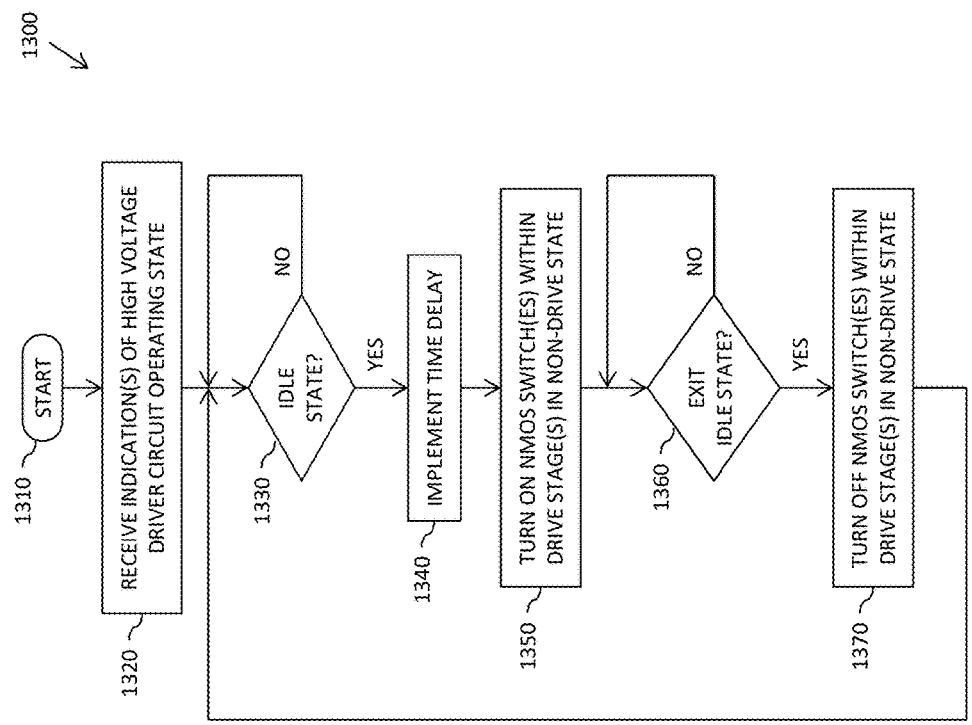
FIG. 13 illustrates a simplified flowchart of an example of a method of protecting against bootstrap capacitance discharge within a high side driver component of a high voltage driver circuit during an idle state of the high voltage driver circuit.

Referring now to FIG. 13, there is illustrated a simplified flowchart 1300 of an example of a method of protecting against bootstrap capacitance discharge within a high side driver component of a high voltage driver circuit during an idle state of the high voltage driver circuit, such as may be implemented within the high side driver component 800 illustrated in FIG. 8. The method starts at 1310, and moves on to 1320 with the receipt of one or more indications of an operating state of the high voltage driver circuit. For example, such an indication may comprise an indication of an output voltage of the high voltage driver circuit and/or a drive signal for the high side driver component, such as illustrated in FIGS. 9 and 11. Next, at 1330, it is determined whether the high voltage driver circuit is in an idle state (e.g. between pulses of a pulse width modulated drive mode). Upon it being determined that the high voltage driver circuit is in an idle state, the method moves on to 1340 where a time delay is implemented. In the illustrated example, NMOS switches within non-drive state drive stages of the high side driver component are turned on to short out the base and the emitter of their parasitic NPN bipolar transistor structures, converting the parasitic NPN bipolar transistor structures into simple P-N junction diode structures. The method then waits, at 1360, until it is determined that the high voltage river circuit is exiting the idle state, at which point the method moves on to 1370 where the NMOS switches within non-drive state drive stages of the high side driver component are turned off. The method then loops back to 1330.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A high voltage driver circuit comprising;
   a high side switching component to provide a supply voltage at a terminal to an output;
   a high side driver component to generate a drive signal at an output thereof to drive the high side switching component, the high side driver component comprising a plurality of drive stages, each drive stage comprising a first switching device controllable to operably couple the output of the high side driver component to a high voltage supply node of the high side driver component, and a second switching device controllable to operably couple the output of the high side driver component to a low voltage supply node of the high side driver component;

wherein the high side driver component is arranged to operate in a reduced slew rate mode in which at least one of the drive stages is arranged to be in a non-drive state; and a discharge protection component to cause the second switching device within the at least one drive stage that is in a non-drive state to be turned on in response to receiving an indication that the high voltage driver circuit is in an idle state and that the high side driver component is operating in the reduced slew rate mode.

2. The high voltage driver circuit of claim 1, wherein the discharge protection component comprises a comparator component arranged to:

receive as the indication of the high voltage driver circuit being in an idle state an indication of an output voltage of the high voltage driver circuit;

compare the received indication of the output voltage of the high voltage driver circuit to a reference voltage value; and output an indication of when the output voltage of the high voltage driver circuit is below the reference voltage value, wherein the discharge protection component is arranged to cause the second switching device within the at least one drive stage in a non-drive state to be turned on, in response to the comparator component outputting an indication that the output voltage of the high voltage driver circuit is below the reference voltage value.

3. The high voltage driver circuit of claim 2, wherein the discharge protection component further comprises a timer circuit, the timer circuit being arranged to:

receive the indication of when the output voltage of the high voltage driver circuit is below the reference voltage value, output by the comparator component; and cause the second switching device within the at least one drive stage in a non-drive state to be turned on, after a time delay from the comparator component outputting an indication that the output voltage of the high voltage driver circuit has dropped below the reference voltage value.

4. The high voltage driver circuit of claim 3, wherein the timer circuit comprises a resistance—capacitance, RC, circuit.

5. The high voltage driver circuit of claim 2, wherein the timer circuit comprises a resistance—capacitance, RC, circuit.

6. The high voltage driver circuit of claim 1, wherein the discharge protection component comprises a counter component arranged to:

receive the indication of the high voltage driver circuit being in an idle state; and cause the second switching device within the at least one drive stage in a non-drive state to be turned on after counting a predetermined number of clock cycles from the indication of the high voltage driver circuit being in an idle state.

7. The high voltage driver circuit of claim 6, wherein the indication of the high voltage driver circuit being in an idle state comprises an indication of a high side driver control signal, and the counter component is arranged to cause the second switching device within the at least one drive stage in a non-drive state to be turned on after counting a predetermined number of clock cycles from a transition within the high side driver control signal from a first, drive logical state to a second, idle logical state.

8. The high voltage driver circuit of claim 7, wherein the predetermined number of clock cycles is defined within a configurable register.

9. The high voltage driver circuit of claim 6, wherein the predetermined number of clock cycles is defined within a configurable register.

10. The high voltage driver circuit of claim 1, wherein the indication of the high voltage driver circuit being in an idle state comprises at least one of:

an indication of a high side driver control signal;
an indication of an output voltage of the high voltage driver circuit.

11. The high voltage driver circuit of claim 1, wherein the second switching device within each drive stage comprises an NMOS device.

12. The high voltage driver circuit of claim 11, wherein the first switching device within each driver stage comprises a PMOS device.

13. The high voltage driver circuit of claim 1, wherein the high side switching device comprises a MOSFET device.

14. The high voltage driver circuit of claim 1 implemented within an integrated circuit device comprising at least one die within a single integrated circuit package.

15. The high voltage driver circuit of claim 1, further comprising:

a low side switching device to couple the output to the ground; and a low side driver component to generate at an output thereof a drive signal to drive the low side switching device.

16. The high voltage driver circuit of claim 1, wherein the at least one high side driver component comprises a floating voltage supply provided by a bootstrap capacitance.

17. The high voltage driver circuit of claim 1, wherein the low voltage supply node is connected to the output.

18. A method comprising:

receiving an indication at a discharge protection component of a high voltage driver circuit that the high voltage driver circuit is in an idle state; and in response to the indication, causing a switching device within a drive stage of a high side driver component that is in a non-drive state to operably couple an output of the high side driver component to a low voltage supply node to prevent a parasitic transistor at the high side driver component from discharging a floating voltage supply, the floating voltage supply provided by a bootstrap capacitance, wherein the high side driver component is arranged to drive a high side switching component, the high side switching component to provide a supply voltage at a terminal to an output of the high voltage driver circuit.

19. The method of claim 18, wherein the low voltage supply node is connected to the output of the high voltage driver circuit.

* * * * *